United States Patent [19]

Weidemann

[11] Patent Number: 4,661,782
[45] Date of Patent: Apr. 28, 1987

[54] INTEGRATED MICROWAVE CAVITY RESONATOR AND MAGNETIC SHIELD FOR AN ATOMIC FREQUENCY STANDARD

[75] Inventor: Werner Weidemann, Mission Viejo, Calif.

[73] Assignee: Ball Corporation, Muncie, Ind.

[21] Appl. No.: 801,269

[22] Filed: Nov. 25, 1985

[51] Int. Cl.[4] .......................... H03L 7/26; H01P 7/06; H01S 1/06
[52] U.S. Cl. ...................................... 331/3; 331/94.1; 324/305; 333/230
[58] Field of Search .................... 331/3, 94.1; 324/304, 324/305, 313; 250/251; 333/227, 230, 228

[56] References Cited

U.S. PATENT DOCUMENTS

| | | | |
|---|---|---|---|
| 3,165,705 | 1/1965 | Dicke | 331/3 |
| 3,510,758 | 5/1970 | Huggett | 331/3 X |
| 3,798,565 | 3/1974 | Jechart | 331/94.1 |
| 3,903,481 | 9/1975 | Jechart | 331/3 |
| 4,349,798 | 9/1982 | Podell et al. | 333/230 |
| 4,405,905 | 9/1983 | Busca et al. | 331/94.1 |
| 4,494,085 | 1/1985 | Goldberg | 331/94.1 |
| 4,495,478 | 1/1985 | Kwon et al. | 333/230 |

*Primary Examiner*—Siegfried H. Grimm
*Attorney, Agent, or Firm*—Gilbert E. Alberding

[57] ABSTRACT

The subject invention relates to an improved microwave cavity resonator and internal magnetic shield of small design for use with an atomic frequency standard. In an embodiment for an optical-physics package the invention comprises a light source, a cell having a predetermined volume in which atoms are contained capable of undergoing a hyperfine transition within a microwave region of the spectrum and disposed to receive the light from said source, a microwave cavity resonator composed of a ferromagnetic or magnetically equivalent material and having a cavity substantially commensurate in volume with the predetermined cell volume, means for detecting the light transmitted through said cell and producing a detection signal representing the transmission of light therethrough, means for subjecting the cell within said cavity to electromagnetic waves inducing the hyperfine transition of the atoms to increase the absorption of the light, means for applying a magnetic field to the cell to provide a substantial bias field to said cavity, said means for applying said magnetic field being generated within the cavity, and control means responsive to the detection signal for modifying the frequency of said electromagnetic waves so as to steer and maintain their frequency substantially centered on the frequency of the hyperfine transition of said atoms.

42 Claims, 1 Drawing Figure

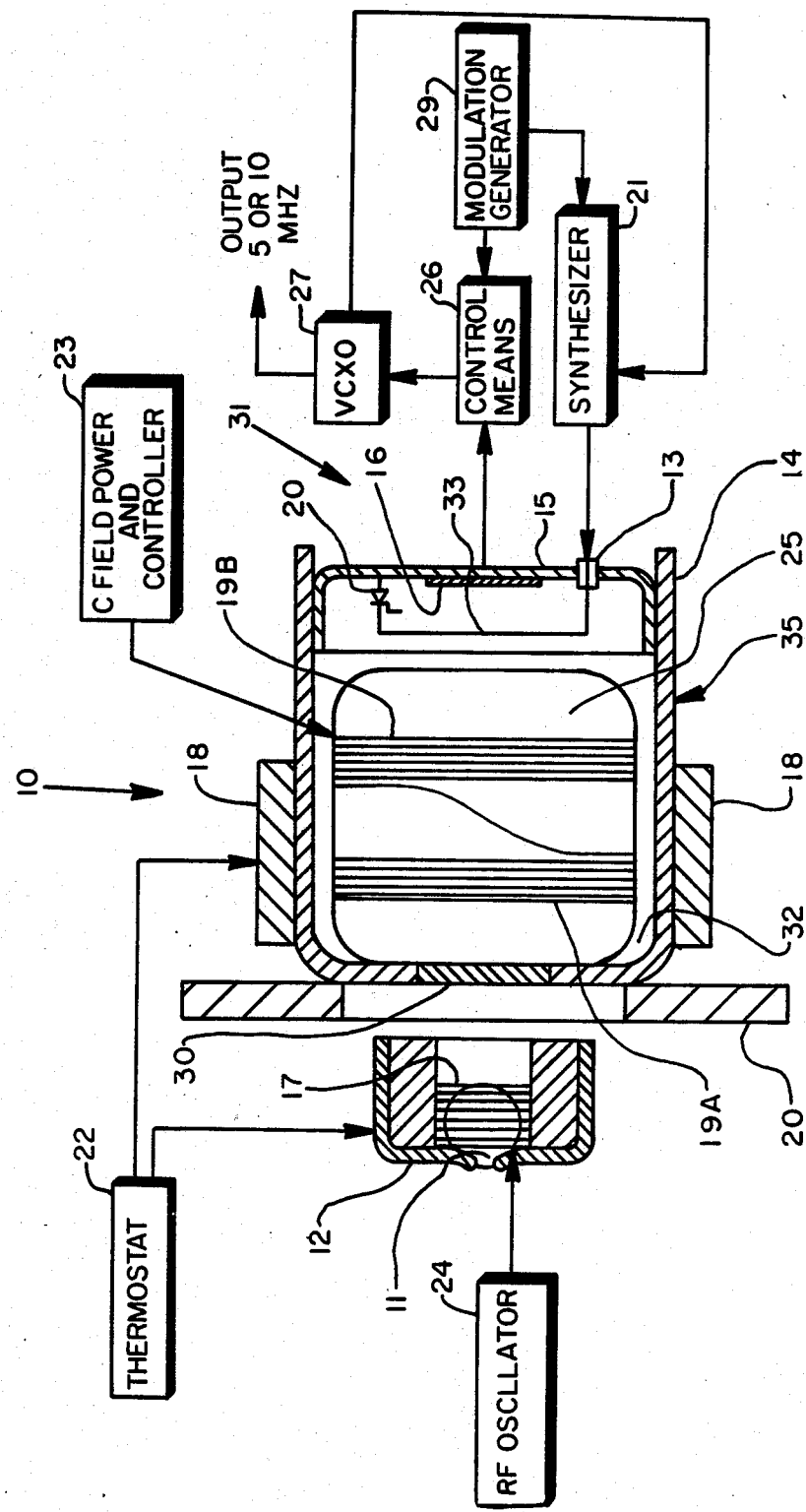

INTEGRATED MICROWAVE CAVITY RESONATOR AND MAGNETIC SHIELD FOR AN ATOMIC FREQUENCY STANDARD

BACKGOUND OF THE INVENTION

1. Field of the Invention

The present invention relates to the field of atomic frequency standards, especially optically-pumped atomic frequency standards. More particularly, this invention relates to an effective integrated microwave cavity resonator and associated components of substantially reduced size for atomic frequency standards, especially a physics package of the optically-pumped type.

2. Description of the Prior Art

An atomic frequency standard is a device having a basic resonant system derived from an atomic or molecular specie experiencing a transition between two well-defined energy levels of the atom or molecule. The transition occurs in a reasonably convenient domain of the electromagnetic spectrum, the microwave region. The transition is employed as a highly stable frequency reference to which the frequency of a quartz crystal resonator or voltage-controlled crystal oscillator (VCXO) can be electronically locked. Thus, the high stability and relative insensitivity associated with an atomic reference frequency is thereby transferred to the quartz crystal resonator or VCXO.

Hydrogen, cesium and rubidium frequency standards are atomic-controlled oscillators in which the frequency of usually a 5 MHz or 10 MHz quartz crystal oscillator is controlled by means of a physics package and associated electronics that are devoted to maintaining that assigned output on a very long-term, exceedingly accurate and stable basis. By properly slaving the quartz crystal oscillator to the frequency of the atomic transition, the tendency of the quartz crystal to exhibit drifting due to aging and other inherent as well as environmental effects is markedly suppressed.

The physics package of an atomic frequency standard of the non-atomicbeam optically-pumped type cqmmonly includes a microwave cavity resonator, an isotopic filter cell, an absorption cell, a light source, a photodetector, temperature control means, and at least one magnetic shield surrounding these components. Over the years there have been substantial efforts by workers in the field to modify the package in order to reduce its overall physical dimensions without, of course, changing its operational characteristics.

One early development made to reduce the overall size for rubidium vapor frequency standards was accomplished by eliminating from the optical-physics package one of its elements, the filter cell, which served to remove one of the hyperfine components emitted by the lamp. This was simply accomplished by combining its function with an associated absorption cell. Thus, the filter material, generally the isotope Rb85 along with a buffer gas, was incorporated directly into the absorption cell containing Rb87. Thus, the absorption cell played simultaneously roles; not only did it act as an absorption cell to create a population difference for Rb87, but, in addition, a filter cell. It followed that by combining these two functions within one absorption cell there resulted a size reduction of the optical-physics package.

Although such approaches have allowed those skilled in the art to make smaller optical-physics packages without loss of significant operating characteristics there still have been considerable efforts made to find yet further ways to decrease their dimensions.

It is, therefore, one object of the subJect invention to provide a novel optical-physics package of substantially reduced size for utilization with atomic frequency standards that employ an optical-physics package of the optically-pumped type.

Another object of the subject invention is to provide a novel optical-physics package of exceptional compactness and yet simplistic in design that does not suffer from loss of operational characteristics, particularly for those environments encountered in communication and navigation.

A further object of the subject invention is to provide a physics package having means for defining a microwave cavity resonator for shielding from magnetic fields produced outside the cavity resonator, the atoms therein undergoing a hyperfine transition that serves as an atomic frequency reference.

Another object of the subject invention is to provide an optical-physics package having means for defining a microwave cavity resonator for magnetically shielding a homogeneous or an inhomogeneous bias magnetic field within the cavity resonator for atomic frequency standards.

Another object of the subject invention is to provide in an optical-physics package means for preventing unwanted external magnetic fields from penetrating the interior of the microwave cavity resonator and is most particularly advantageous in its utilization wherein homogeneous or uniform fields are employed in that said fields can be maintained pure and free of outside interference that would hamper their field homogeneity.

Yet another object of this invention is to provide an optical-physics device of less physical mass in comparison with conventional devices.

Moreover, it is an important object of this invention to provide a novel microwave cavity resonator that has aspects that make it useful not only in the field of optical-physics packages but also as a cavity resonator for atomic or molecular beam frequency standards as well.

These, together with other objects and advantages which will become subsequently apparent, reside in the details of construction and operation as more fully hereinafter described and claimed.

BRIEF SUMMARY OF THE INVENTION

Cavity resonators used in conjunction with frequency standards take a number of general forms but are usually cylindrical or rectangular in shape and are constructed of non-ferrous conductive metals such as copper, aluminum and the like. These resonators are generally designed to support either the $TE_{011}$ or $TE_{111}$ modes, as both modes provide good coupling to conventional absorption cells. Moreover, it has been the practice in the prior art to employ magnetic shielding devices that encompass such cavity resonators and are spaced therefrom. These devices are often nestled within one another forming a plurality of concentric or nested shields surrounding the optical-physics package including the cavity resonator, each shielding element being composed of a material having high permeability in low magnetic fields, such as mu metal, Molypermalloy and the like. It will be appreciated that although such shielding structures themselves have contributed to the outward relative size and bulkiness of conventional atomic frequency standards, little attention has been paid to said structures, as such shielding in relation to the other components are indeed necessary components of the total optical-physics package. Since the trend is to miniaturize or substantially reduce the dimensions of atomic frequency standards, it became apparent to the applicant that certain changes or modifications in such major structures would significantly contribute to size reduction.

Although the concept of altering the functional or compositional nature of a cavity resonator might appear retrospectively to be somewhat of a straightforward approach, this development and its ramifications have apparently alluded others for it apparently has not been anticipated or suggested by those skilled in the art, particularly those working in the field of atomic frequency standards having a physics package of the optically-pumped type.

It has been discovered that a substantial reduction in size may be readily accomplished without any significant functional loss by using a highly magnetically permeable material for the microwave cavity resonator itself and, therefore, eliminating entirely the prior art microwave cavity resonator made of non-magnetic materials. By the utilization of a highly magnetically permeable material to serve within the confines of the cavity resonator itself, it follows that the field produced by exciting the space therein with microwave energy becomes coextensive or substantially coextensive with that of a magnetic bias field, which may be either static or slowly varying, produced inside the microwave cavity resonator. This bias field may be homogeneous (uniform) or inhomogeneous (non-uniform).

From a somewhat broad and rather important aspect the subject invention provides a novel resonator structure for atomic frequency standards that can readily accommodate not only those standards of the optical-physics package type but also those employing atomic or molecular beam techniques in that said resonator structure functions not only as a cavity resonator for receiving microwave radiation to produce desirable and useful atomic transitions but also as a confining housing with magnetic shielding properties for generating therein either a homogeneous or an inhomogeneous magnetic field to afford separation between energy sublevels of atomic or molecular species.

The subject invention relates broadly to a microwave cavity resonator for an atomic frequency standard comprising a cavity resonator formed of highly magnetic permeable material, means for injecting microwave radiation within said resonator capable of producing atomic transitions of atoms, and means for applying a magnetic field in the presence of said cavity resonator. Further, the instant invention relates to a method of producing an atomic transition of atoms within a magnetic field to induce a stable frequency therefrom comprising magnetically shielding a given volume of atoms, generating a magnetic field confined to said same volume to afford separation between energy sublevels of said atoms, and injecting into said volume microwave energy to induce the transition of said atoms to produce said frequency.

From yet another aspect the subject invention relates to an atomic frequency standard comprising a light source, an absorption cell of a predetermined volume containing an amount of atoms capable of undergoing a hyperfine transition within a microwave region of the spectrum and disposed to receive the light from said source, an integral microwave cavity resonator composed of a ferromagnetic or magnetically equivalent material and having a cavity in congruence or substantially commensurate in volume with the predetermined volume of said cell containing said atoms, means for detecting the light transmitted through said absorption cell and producing a detection signal representing the transmission of light therethrough, means for subjecting the absorption cell within said cavity to electromagnetic waves inducing the hyperfine transition of the atoms to increase the absorption of the light by said absorption cell, means for generating a homogeneous or inhomogeneous magnetic field within said cavity to provide a substantial magnetic bias field in said cavity, and control means responsive to the detection signal for modifying the frequency of said electromagnetic waves so as to steer the frequency thereof to the frequency of the hyperfine transition of said atoms of interest.

Another aspect of the instant invention may be viewed as an improvement in an optical-physics package, especially for use with an atomic frequency standard, said package comprising a light source, means for providing for a cavity resonator for microwave radiation therein and magnetic shielding to define a magnetic field within the same resonant cavity, and an absorption cell associated therewith and contoured to accommodate said resonant cavity positioned therein for concurrent exposure to said bias magnetic field and said microwave electromagnetic field.

From another point of view, the subject invention relates to an optical-physics package for atoms capable of undergoing atomic transitions as associated with atomic frequency standards including a microwave cavity resonator, the improvement comprising means for providing microwave energy field within said cavity resonator to initiate atomic transitions in the population of said atoms and means for providing a magnetic bias field within the same cavity resonator wherein both fields are in congruence and within substantially the same boundaries as defined by said cavity resonator.

BRIEF DESCRIPTION OF THE DRAWINGS

The accompanying drawing, which is incorporated in and constitutes a part of this patent specification, illustrates a preferred embodiment of the subject invention and, together with the description herein, serves to explain the principles of the invention.

The accompanying drawing is a side-section view of the optical-physics package along with the associated electrical components schematically shown and incorporating the teachings of the present invention.

DESCRIPTION OF THE PREFERRED EMBODIMENTS

In the embodiment of the optical-physics package 10 illustrated in the drawing which is directed to an embodiment using one of the alkali metals, viz., rubidium, an electrodeless gas discharge lamp 11, which is evacuated and filled with rubidium, plus a suitable buffer gas at a pressure, generally about 2 torr (0.27 k Pa), is surrounded by an exciter coil 17, said coil 17 being activated by a radio-frequency oscillator 24. The lamp 11 within a lamp housing 12 of the optical-physics package 10 is arranged with a thermostat 22 which renders a controllable temperature, usually about 115° C., which is required for generating the requisite rubidium vapor pressure in the lamp 11. As can be appreciated, the thermostat 22 keeps the temperature of the liquid rubidium metal constant within narrow limits, as the light emitted by the lamp 11 is dependent on variations in the rubidium vapor pressure and, hence, on this temperature.

The light radiated from the lamp 11 arrives at a photodetector 16 after transversing an absorption cell 25 positioned between lamp 11 and photodetector 16. The absorption cell 25 comprises an evacuated cylindrical glass bulb which is likewise filled with vaporized rubidium having a suitable vapor pressure and with a buffer gas, such as nitrogen or argon, or some mixture of such buffer gases.

In the particular embodiment of the optical-physics package 10 shown herein, it should be observed that no separate filter cell is employed as is often conventional in such devices, but instead an absorption cell 25 of special design as that described in U.S. Pat. No. 3,903,481 to Ernest Jechart is contemplated. Thus, the absorption cell 25 is one containing an isotopic mixture and, more particularly, a mixture of Rb85 and Rb87; the lamp 11 also contains a mixture of Rb85 and Rb87 atoms in accordance with the teaching of said patent to Jechart. When the Rb87 in the lamp 11 is excited it emits light having a spectrum containing the two strong optical lines of Rb87 ($D_1$ at 794.8 nm and $D_2$ at 780.0 nm) each of which, in turn, contains two main hyperfine components. A beam of such light transversing the absorption cell 25 containing the buffer gas as well as the mixture of Rb85 and Rb87 isotopes causes the preferential absorption of one of the hyperfine components for both $D_1$ and $D_2$ lines. The remaining $D_1$ and $D_2$ spectral component serves as optical pumping light and brings about a population inversion between the two ground state hyperfine levels of Rb87 in the absorption cell 25. Preferentially, only those atoms that are in the lower hyperfine state absorb the optical pumping light and are raised into optically-excited high-energy states.

Furthermore, by spontaneous emission, such atoms return to one of the ground hyperfine states. Because the number of atoms able to absorb the optical pumping light become fewer in number the absorption cell 25 tends to become transparent. Upon introduction of microwave radiation by means for generating such radiation 31 within a microwave cavity 35 resonant at a frequency of 6.834 . . . GHz, the frequency corresponding to the energy gap between the two ground state hyperfine levels, there is produced a population increase of atoms in the lower hyperfine level. This results in an increase in light absorption. The atoms that arrive in this lower state are, of course, optically pumped and raised to higher energy states. As the atoms drop into the lower ground state hyperfine level from the upper ground state hyperfine levels, a correspondingly smaller amount of light reaches the photodetector 16 since light is being actively absorbed by Rb87. When there is less light reaching the photodetector 16 there is a corresponding reduction in the photocurrent produced by the photodetector 16. This decrease in light, when the microwave frequency is equal to the very-sharply-defined rubidium frequency, is then converted electronically to an error signal with amplitude and phase information that is used to steer the VCXO 27 via its control voltage to keep it at a frequency of 10 MHz. Upon this occurrence, VCXO 27 is frequency locked to the stable atomic transition frequency. Thus, by use of the above described scheme the VCXO 27 is exactly 10 MHz when the microwave frequency is exactly equal to the frequency of the rubidium transition.

It is to be noted that the photodetector 16 and absorption cell 25 are fully enclosed within the microwave cavity resonator 35 which is of cylindrical design and includes a cylindrical body 14 having a light-permeable dielectric window 30 therein and a lid 15 integrally connected to said body 14 to thereby fully seal the same. In accordance with this invention, it has been found most advantageous that the cavity resonator 35 be constructed of a material having high magnetic permeability in low magnetic fields. It can be seen that the cavity resonator 35 is closed to the outer air and thus may, when connected to a heater ring 18, be advantageously controlled to maintain by heat control means 22 a constant temperature, e.g., 75° C. In one embodiment the material of the cavity resonator 35 may comprise a nickel-steel alloy containing about 17 to about 20% iron, about 5% copper and low percentages of manganese or chromium. In general, however, any of a host of ferromagnetic compositions or materials capable of rendering equivalent magnetic-permeable properties such as metals or alloys of high magnetic permeability may serve as the resonant cavity 35 as long as such permeability is at least equal to if not significantly greater than that of pure iron with or without additional constituents, such as cobalt and chromium. Such metals, as known, provide effective shielding from the earth's magnetic field and from any other magnetic field or fields which might cause interference in order to achieve the desired precise control of the resonant frequency of operation. The resonator cavity 35 is generally silver plated, or copper plated at first and thereafter silver plated.

A current supplied to the windings 19 cause a magnetic field known as a "C field" to be established. A number of C field windings 19 are made around the inside wall of the microwave cavity resonator and, hence, around the absorption cell 25. Thus, the windings 19 are disposed inside the cavity resonator 35 for producing by means of a C field power and controller 23 a magnetic field of a predetermined intensity. Generally, this could vary over a wide range but is usually between about 0 to about 1 gauss. Although any number of wound sections may be used, two separately energizable sections may be readily utilized as shown, 19a and 19b. One of the functions of the C field windings 19 is to create in operation a magnetic bias field in the microwave cavity resonator 35 and, therefore, within the absorption cell 25. The coils 19a and 19b may be wound around the outside of the absorption cell 25 and any separation or space 32 between the absorption cell 25 and said cavity resonator 35 may be readily filled with a non-magnetic polymer material such as polymeric silicone elastomers including room temperature-vulcanizing silicone rubber compounds, organosiloxane polymers and the like. Generally, the windings 19 consist of a single layer of turns of insulated copper wire. The C field windings 19 are placed in an appropriate position to create in the present embodiment a predetermined inhomogeneous magnetic field not exceeding approximately one gauss to bias magnetically the absorption cell 25 and thereby to separate the Zeeman levels of each hyperfine state of the vapor atoms. Connected through the wall of lid 15 is a microwave input means comprising a feed-through capacitor 13 coupled to a step recovery diode 20 by means of a conductor 33. By such input means microwave energy is rendered to the interior of the cavity resonator 35 to provide microwave coupling thereto.

Except for the C field, the subject device provides for means for excluding externally produced magnetic fields, including low frequency magnetic fields, within the microwave cavity resonator which would cause, if allowed to penetrate therethrough, adverse effects upon atoms capable of undergoing hyperfine transitions in the favorable manner herein described. By the teachings of the subject invention a significant advance is made over other conventional microwave cavity resonators, especially those employed in optical-physics packages, by rendering means for providing and maintaining a C field within and commensurate in dimensions with the confines of the microwave cavity resonator itself. It can be appreciated that in a conventional optical-physics package a current-carrying component (e.g., heating element) situated outside the standard microwave cavity resonator yet inside the magnetic shielding structure of the package would seemingly effect interference in the operation of the absorption cell and, more particularly, hamper the atoms within said cell capable of undergoing hyperfine transitions. The adverse effects of such an interfering or spurious field caused by such a component is entirely eliminated by the means of the subject invention in that the absorption cell and the confined atoms therein are fully isolated from such effects. In one embodiment this is found particularly advantageous as regards the production of a homogeneous or uniform magnetic field within such a resonator for once such a homogeneous field is established it can be readily maintained in its pure form, free of outside interference that would tend to destroy its homogeneity.

As previously discussed, the microwave cavity resonator 35 is excited with microwave energy at the atomic resonance frequency of the atomic vapor within the absorption cell 25 and in the case of rubidium at a frequency of 6.834 . . . GHz. In practice, this signal is derived from the 10 MHz VCXO 27 by means of a frequency synthesizer and modulator 21. Thus, the microwave energy applied to the cavity resonator 35 is frequency modulated at a low modulation frequency, generally about 150 hertz. The output of the synthesizer 21, which is generally about 60 MHz plus an additional signal of 5.3125 MHz, is applied to a microwave generating means including the feed-through capacitor 13, the step recovery diode 20 and the length of the conductor 33. As is known, the step recovery diode 20 functions as a harmonic generator and mixer producing an output signal that contains multiple harmonics of the input signal, the one hundred fourteenth harmonic of the input 60 MHz frequency being 6.84 GHz. Additionally, the diode 20 functions as a mixer to render microwave energy at a frequency of 6834.6875 MHz (6840.0000 MHz–5.3125 Mz), the frequency of Rb87 in accordance with the preferred embodiment. As already discussed, the injection of electromagnetic energy at this frequency interacts with the rubidium absorption cell 25 to produce a detectable partial reversal of the optical pumping process.

An error signal is generated to control the VCXO 27 by the following scheme. The AC signal from the photodetector 16 is coupled to an amplifier located at a station 26 and the amplified signal is applied to a synchronous demodulator at station 26 which also receives a signal from a modulation generator 29. By this means it can be determined if the carrier frequency of the signal applied to the cavity resonator 35 is properly centered on the frequency of the hyperfine transition 6.834 . . . GHz. Any deviation or displacement results in an error signal at the output of the demodulator at station 26. This signal is used to control the VCXO 27 which may be modified so as to maintain the frequency of the synthesized microwave signal at 6.834 . . . GHz centered on the frequency of the hyperfine transition of rubidium.

It is to be understood that a number of modifications to the abovedescribed invention may be made by those skilled in the art, and it is intended to cover all such modifications which fall within the spirit and scope of the appended claims.

What is claimed is:

1. A microwave cavity resonator for an atomic frequency standard comprising a cavity resonator formed of highly magnetically permeable material, means for injecting microwave radiation within said resonator capable of producing atomic transitions of atoms, and means for applying a magnetic field in the presence of said cavity resonator.

2. A microwave cavity resonator as recited in claim 1 wherein said means for applying the magnetic field comprise means for applying a homogeneous magnetic field.

3. A microwave cavity resonator as recited in claim 1 wherein said means for applying the magnetic field comprises means for applying an inhomogeneous magnetic field.

4. A microwave cavity resonator for an atomic frequency standard comprising a cavity resonator defined by high magnetic permeability and containing therein a supply of atoms capable of undergoing a hyperfine transition within a microwave region of the spectrum, and means within said resonator for inducing the hyperfine transitions.

5. A microwave cavity resonator for an atomic frequency standard comprising a cavity resonator formed of highly magnetically permeable material, means for injecting energy, E, by means of microwave radiation of a predetermined frequency, f, wherein said frequency, f, is related to E through the equation $E = hf$ where h is Planck's constant, said frequency producing an atomic transition of atoms, and means for applying a magnetic field in the presence of said cavity resonator to afford separation between energy sublevels of said atoms.

6. In an optical-physics package for use with an atomic frequency standard including a microwave cavity resonator, the improvement comprising means for providing microwave energy within said cavity resonator to initiate a standing wave field therein, said microwave cavity resonator being composed of a highly magnetically permeable material, and means for providing a magnetic bias field within the same cavity resonator wherein both fields occupy the same cavity resonator and are substantially in congruence with each other.

7. In the package as recited in claim 6 wherein the magnetic field is a uniform magnetic bias field generated by currents carried by windings within the cavity resonator.

8. In the package as recited in claim 6 wherein the magnetic field is a non-uniform magnetic bias field generated by currents supplied by windings within the cavity resonator.

9. In an optical-physics package for use with an atomic frequency standard including a microwave cavity resonator, the improvement comprising means for providing microwave energy within said cavity resonator to initiate a standing wave field therein, and means for providing a magnetic bias field confined substantially within said cavity resonator, said cavity resonator being composed of magnetic shielding material and having an overlayer of a non-ferrous metal, said standing wave field and said magnetic bias field being substantially coextensive with one another within said cavity resonator.

10. In the package as recited in claim 9 wherein the cavity resonator is designed to support the $TE_{111}$ mode.

11. In the package as recited in claim 9 wherein the magnetic field is a non-uniform magnetic bias field generated by a direct current carried by windings within the cavity resonator.

12. In the package as recited in claim 9 wherein the magnetic field is a uniform magnetic bias field generated by currents supplied by windings within the cavity resonator.

13. In the package as recited in claim 9 wherein the cavity resonator is composed of nickel-steel alloy.

14. An atomic frequency standard comprising a light source, a cell containing a predetermined volume of atoms capable of undergoing a hyperfine transition within a microwave region of the spectrum and disposed to receive light from said source, means for defining a microwave cavity resonator for magnetically shielding the atoms undergoing the hyperfine transition within said cavity resonator, means for detecting the light transmitted through said cell and producing a detection signal representing the transmission of light therethrough, means for subjecting the cell within said cavity resonator to electromagnetic waves inducing the hyperfine transition of the atoms to increase the absorption of the light, and means for controlling in response to the detection signal for modifying the frequency of said electromagnetic waves so as to tune their frequency to the frequency of the hyperfine transition of said atoms.

15. An atomic frequency standard as recited in claim 14 wherein the cell contains an isotopic mixture of atoms.

16. An atomic frequency standard as recited in claim 14 wherein the cell contains members selected from the group consisting of thallium, rubidium, hydrogen, cesium, magnesium, calcium and mercury.

17. An atomic frequency standard as recited in claim 14 wherein said means for defining a resonant cavity for electromagnetic shielding comprises a nickel-iron alloy and said alloy is provided with a non-ferrous overlayer.

18. An atomic frequency standard as recited in claim 14 wherein the resonant cavity is substantially coextensive with the cell.

19. An atomic frequency standard comprising a light source, a cell containing a predetermined volume of atoms capable of undergoing a hyperfine transition within a microwave region of the spectrum and disposed to receive the light from said source, an integral resonator composed of a highly magnetically permeable material and having a cavity substantially commensurate in volume with the predetermined volume, means for detecting the light transmitted through said cell and producing a detection signal representing the transmission of light therethrough, means for subjecting the cell within said cavity to electromagnetic waves inducing the hyperfine transition of the atoms to increase the absorption of the light, means for applying a magnetic field to the cell to provide a bias field in said cavity, said means for applying the magnetic field being generated within said cavity, and control means responsive to the detection signal for modifying the frequency of said electromagnetic waves so as to tune their frequency to the frequency of the hyperfine transition of said atoms.

20. An atomic frequency standard as recited in claim 19 wherein the highly magnetically permeable material of the resonant cavity is a silver plated nickel-steel alloy.

21. An atomic frequency standard as recited in claim 19 wherein the length through the resonator cavity as transversed by the light is substantially equal to the length of said resonator cavity.

22. An optical-physics package of reduced size for use with an atomic frequency standard, comprising a light source, a cavity resonator formed of highly magnetically permeable material and having means for providing microwave excitation and a magnetic field within said cavity resonator, and an absorption cell contoured to accommodate said cavity resonator and positioned therein for concurrent exposure to the microwave excitation, the magnetic field and the light source thereof.

23. The optical-physics package of claim 22 wherein the cavity resonator is designed to support the $TE_{111}$ mode.

24. The optical-physics package of claim 23 wherein the magnetic field within the cavity resonator is a homogeneous field.

25. The optical-physics package of claim 23 wherein the magnetic field wherein the cavity resonator is an inhomogeneous field.

26. The optical-physics package of claim 22 wherein the means for providing said microwave excitation comprises a step recovery diode and said magnetic field is produced by a current-carrying winding within the cavity resonator and surrounding the absorption cell.

27. An optical-physics package of reduced size for use with an atomic frequency standard, comprising a light source, means for defining a cavity resonator for shielding atoms undergoing hyperfine transitions from externally produced magnetic fields, and an absorption cell contoured to accommodate said cavity resonator and positioned therein for concurrent exposure to the light from said light source and a bias magnetic field generated within said cavity resonator.

28. The optical-physics package of claim 27 wherein the cavity resonator is defined by a ferrous alloy.

29. The optical-physics package of claim 28 wherein the alloy is a nickel-steel alloy.

30. The optical-physics package of claim 27 wherein the cavity resonator is designed to support the $TE_{111}$ mode.

31. The optical-physics package of claim 27 wherein the magnetic field within the cavity resonator is a homogeneous field.

32. The optical-physics package of claim 27 wherein the magnetic field within the cavity resonator is an inhomogeneous field.

33. The optical-physics package of claim 27 wherein the absorption cell contains atoms selected from the group consisting of thallium, rubidium, hydrogen, cesium, magnesium, calcium and mercury.

34. The optical-physics package of claim 27 wherein the absorption cell contains an isotopic mixture of atoms.

35. The optical-physics package of claim 34 wherein the isotopic mixture comprises Rb85 and Rb87.

36. In an optical-physics package for use with an atomic frequency standard including a microwave cavity resonator, the improvement comprising means for providing microwave energy within said cavity resonator to initiate a standing wave field therein, said cavity resonator being composed of magnetic shielding material, and means for providing a magnetic bias field within the same cavity resonator wherein both fields occupy the same cavity resonator and are substantially in congruence with each other.

37. The optical-physics package of claim 36 wherein the shielding material of said cavity resonator is a ferrous alloy.

38. The optical-physics package of claim 36 wherein the shielding material of said cavity resonator is a nickel-steel alloy.

39. The optical-physics package of claim 36 wherein the shielding material of said cavity resonator is a ferromagnetic composition.

40. An optical-physics package of reduced size for use with an atomic frequency standard, comprising a light source, a cavity resonator formed of highly magnetically permeable material comprising nickel-steel alloy and having means for providing microwave excitation and a magnetic field within said cavity, and an absorption cell contoured to accommodate said cavity resonator and positioned therein for concurrent exposure to the microwave excitation, the magnetic field and the light source thereof.

41. An optical-physics package of reduced size for use with an atomic frequency standard, comprising a light source, a cavity resonator formed of highly magnetically permeable material comprising mu metal and having means for providing microwave excitation and a magnetic field within said cavity, and an absorption cell contoured to accommodate said cavity resonator and positioned therein for concurrent exposure to the microwave excitation, the magnetic field and the light source thereof.

42. An optical-physics package of reduced size for use with an atomic frequency standard, comprising a light source, a cavity resonator formed of highly magnetically permeable material comprising nickel-steel alloy having an overcoating of electroplated silver thereon and having means for providing microwave excitation and a magnetic field within said cavity, and an absorption cell contoured to accommodate said cavity resonator and positioned therein for concurrent exposure to the microwave excitation, the magnetic field and the light source thereof.

* * * * *